(12) United States Patent
Huang

(10) Patent No.: US 8,078,947 B2
(45) Date of Patent: Dec. 13, 2011

(54) DATA PROCESSING CIRCUIT AND METHOD

(75) Inventor: Shih-Chang Huang, Magong (TW)

(73) Assignee: Macronix International Co., Ltd., Hsinchu (TW)

( * ) Notice: Subject to any disclaimer, the term of this patent is extended or adjusted under 35 U.S.C. 154(b) by 819 days.

(21) Appl. No.: 12/173,118

(22) Filed: Jul. 15, 2008

(65) Prior Publication Data

US 2010/0017663 A1    Jan. 21, 2010

(51) Int. Cl.
*H03M 13/00*    (2006.01)
(52) U.S. Cl. .................. 714/785; 714/763; 714/774
(58) Field of Classification Search .................. 714/785, 714/763
See application file for complete search history.

(56) References Cited

U.S. PATENT DOCUMENTS

| 4,688,207 A * | 8/1987 | Yoshimoto | 370/310 |
| 2002/0108088 A1* | 8/2002 | Kim | 714/784 |
| 2007/0174755 A1* | 7/2007 | Lee et al. | 714/762 |

* cited by examiner

*Primary Examiner* — M. Mujtaba K Chaudry
(74) *Attorney, Agent, or Firm* — Thomas|Kayden

(57) ABSTRACT

A data processing method is provided. Target page data are read from a memory cell array and addresses of multiple programmed-error bits are stored. A first syndrome polynomial and a second syndrome polynomial are obtained according to the target page data, and the target page data are saved as a first codeword and a second codeword. An errata locator polynomial is obtained according to the syndrome polynomials, and a first error count and a second error count are obtained according to the errata locator polynomial, the first codeword and the second codeword. A set of reference codes is obtained according to the errata locator polynomial. Read page data are outputted according to the addresses of the programmed-error bits, the first error count and the second error count. The read page data are corrected according to the set of reference codes to obtain corrected read page data.

13 Claims, 4 Drawing Sheets

| | 1 | 1 | 1 | 1 | 1 |
|---|---|---|---|---|---|

| | 1 | 1 | 1 | 1 | 0 |
|---|---|---|---|---|---|

| | 1 | 1 | 1 | 0 | 0 |
|---|---|---|---|---|---|

| | 1 | 1 | 0 | 0 | 0 |
|---|---|---|---|---|---|

| | 1 | 0 | 0 | 0 | 0 |
|---|---|---|---|---|---|

| | 0 | 0 | 0 | 0 | 0 |
|---|---|---|---|---|---|

| First error count | Second error count |
|---|---|
| 0 | 3 |
| 1 | 3 |
| 2 | 3 |
| 3 | 3 |
| 3 | 2 |
| 3 | 1 |
| 3 | 0 |

FIG. 3

DATA PROCESSING CIRCUIT AND METHOD

BACKGROUND OF THE INVENTION

1. Field of the Invention

The invention relates in general to data processing circuit and method, and more particularly to data processing circuit and method of a memory module, in which the hardware cost can be lowered.

2. Description of the Related Art

Memories are applied to various data storing purposes. FIG. 1 (Prior Art) is a schematic illustration showing an example of a conventional memory 100. Referring to FIG. 1, the memory 100 includes multiple word lines WL, multiple bit lines BL and multiple memory cell blocks, such as a first memory cell block 110 and a second memory cell block 120. Each memory cell block includes multiple memory cells arranged in an array. Each memory cell includes a transistor. In addition, the single memory cell block includes multiple Y-type multiplexers each coupled to a sense amplifier 130.

If the memory is a pre-programmed memory, predetermined data has to be programmed into the memory before the memory is shipped to the customer. At this time, if the operation zone of the memory is insufficient, the memory may have errors when the memory cells are programmed. Therefore, the memory usually encounters a margin threshold voltage test (margin VT test) to find out a column memory cell with a programmed-error. In addition, a column repair operation is performed using a column repair unit in a repair unit block 140 to replace the column memory cell having the programmed-error. However, the memory 100 must have the additional repair unit block 140 so that the hardware cost of the memory 100 is increased.

SUMMARY OF THE INVENTION

The invention is directed to data processing circuit and method, and more particularly to data processing circuit and method of a memory module, in which multi-bit error correction codes are used to reduce the number of column repair units so that the available capacity of the memory is increased and the hardware cost of the memory is lowered.

According to a first aspect of the present invention, a data processing circuit is provided. The data processing circuit includes a page buffer, a first syndrome calculator, a second syndrome calculator, a key equation device, a Chien searcher, an address counter, a latch, a switching device and a correcting unit. The page buffer stores target page data. The first syndrome calculator and the second syndrome calculator obtain a first syndrome polynomial and a second syndrome polynomial according to the target page data, and respectively save the target page data as a first codeword and a second codeword. The key equation device obtains an errata locator polynomial according to the first syndrome polynomial and the second syndrome polynomial, and obtains a first error count and a second error count according to the errata locator polynomial, the first codeword and the second codeword. The Chien searcher obtains a set of reference codes according to the errata locator polynomial. The address counter stores addresses of a plurality of programmed-error bits. The latch is coupled to the address counter and for temporarily storing the addresses of the programmed-error bits. The switching device is coupled to the key equation device, the latch and the page buffer, and for outputting read page data according to the addresses of the programmed-error bits, the first error count and the second error count. The correcting unit corrects the read page data according to the set of reference codes to obtain corrected read page data.

According to a second aspect of the present invention, a data processing method is provided. Target page data are read from a memory cell array and addresses of multiple programmed-error bits are stored. A first syndrome polynomial and a second syndrome polynomial are obtained according to the target page data, and the target page data are saved as a first codeword and a second codeword. An errata locator polynomial is obtained according to the first syndrome polynomial and the second syndrome polynomial, and a first error count and a second error count are obtained according to the errata locator polynomial, the first codeword and the second codeword. A set of reference codes is obtained according to the errata locator polynomial. Read page data are outputted according to the addresses of the programmed-error bits, the first error count and the second error count. The read page data are corrected according to the set of reference codes to obtain corrected read page data.

The invention will become apparent from the following detailed description of the preferred but non-limiting embodiments. The following description is made with reference to the accompanying drawings.

BRIEF DESCRIPTION OF THE DRAWINGS

FIG. 3 is a partially schematic illustration showing a first error count and a second error count according to the preferred embodiment of the invention.

DETAILED DESCRIPTION OF THE INVENTION

The invention provides data processing circuit and method, and more particularly to data processing circuit and method of a memory module, in which multi-bit error correction codes (ECC) are used to reduce the number of column repair units, to increase the overall available capacity of the memory, and thus to lower the hardware cost of the memory.

Nowadays, memories are applied to various data storing purposes. The process of ensuring the completeness of the data stored in the memory is a very important issue in designing the memory. Usually, error correction codes (ECC) are used to achieve this requirement. However, the capacity of the memory is getting larger and larger, and the conventional error correction code, such as the Hamming code, for detecting and correcting 1 bit of error cannot satisfy the present requirement, and is replaced with the error correction codes capable of detecting and correcting multiple bits of errors.

Figure 1:
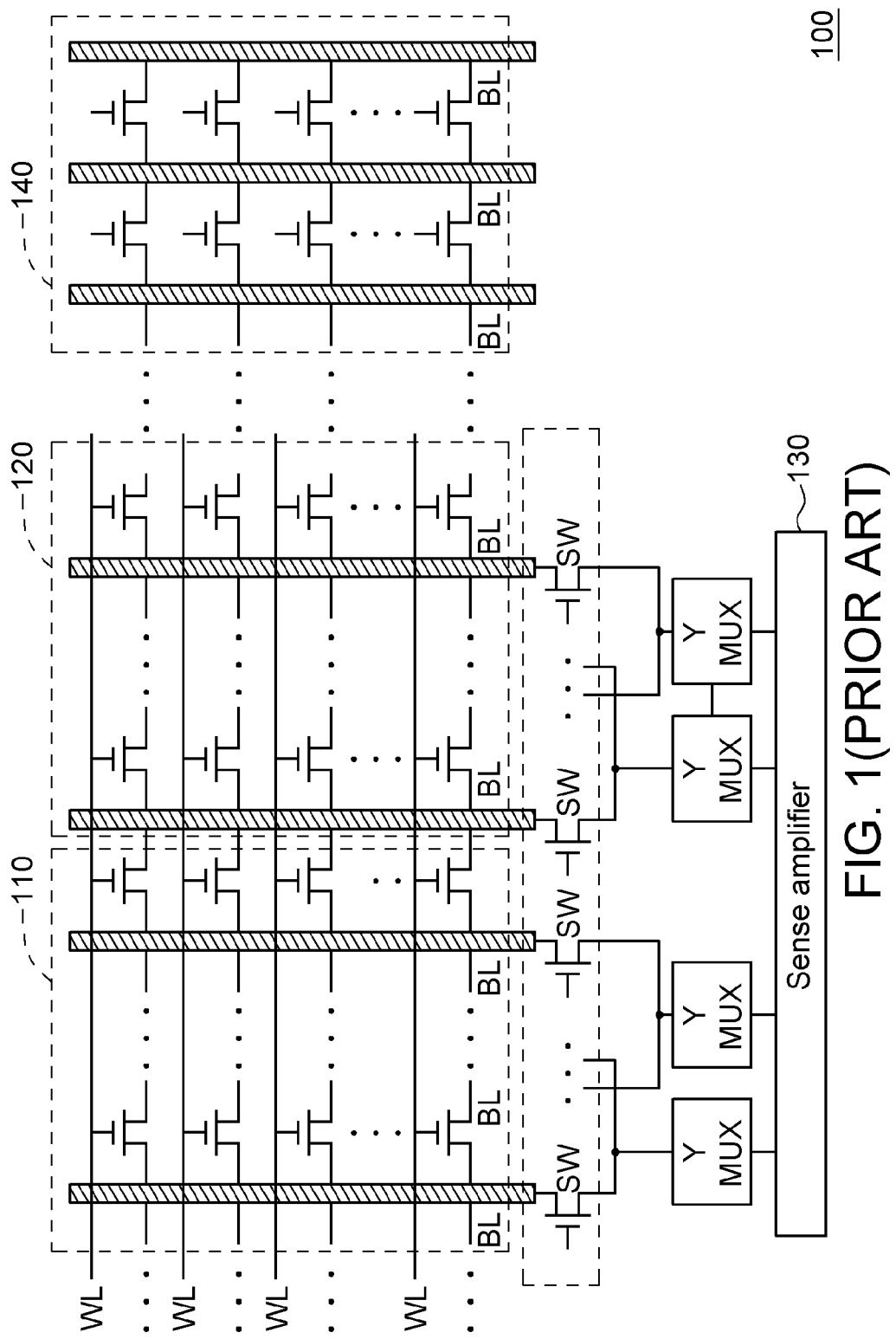
FIG. 1 (Prior Art) is a schematic illustration showing an example of a conventional memory.
Figure 2:
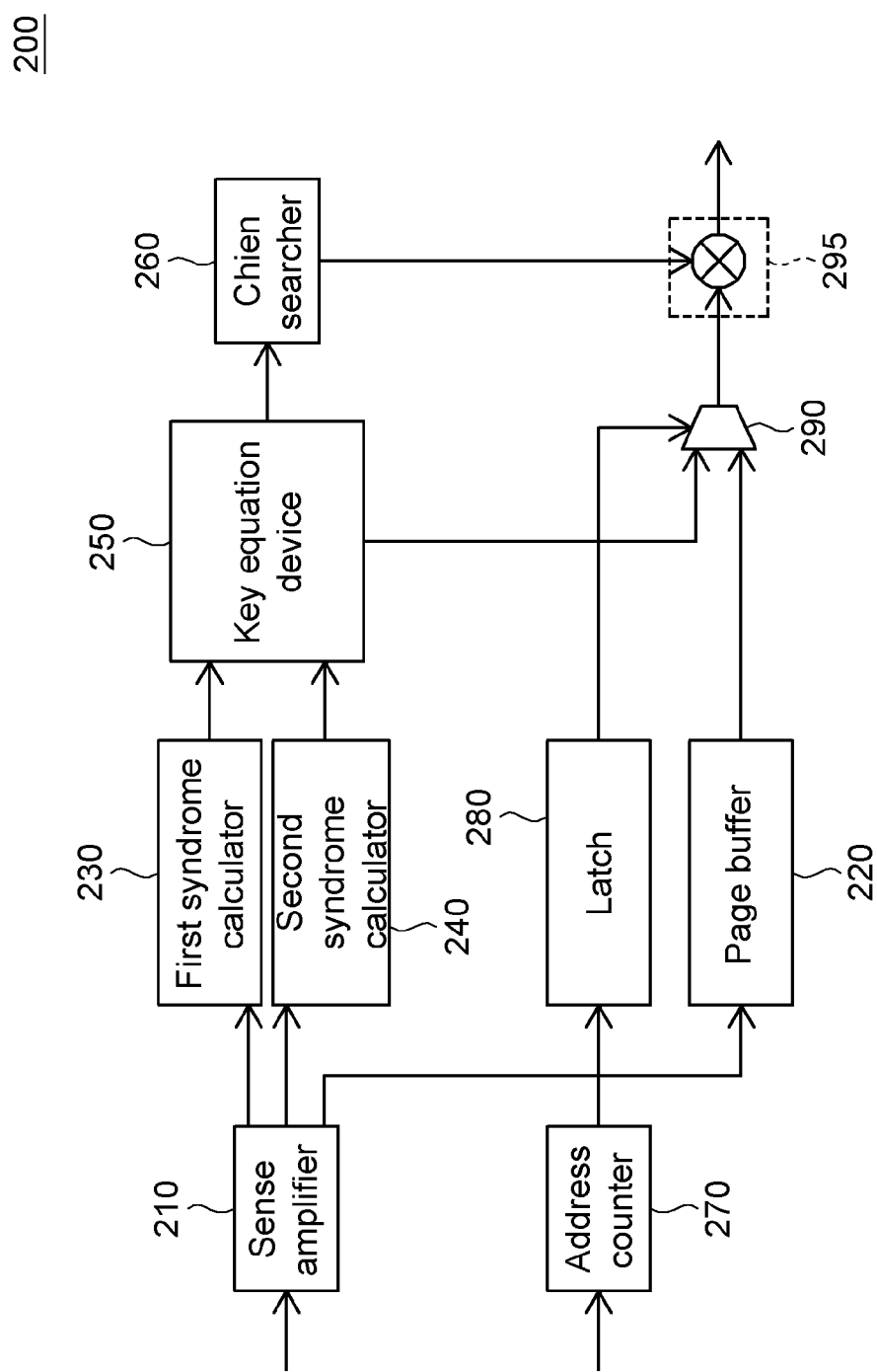
FIG. 2 is a block diagram showing a data processing circuit of a memory module according to a preferred embodiment of the invention.

FIG. 2 is a block diagram showing a data processing circuit 200 of a memory module according to a preferred embodiment of the invention. Referring to FIG. 2, the data processing circuit 200 includes a sense amplifier 210 (optional element that may be disposed in the data processing circuit 200 or not), a page buffer 220, a first syndrome calculator 230, a second syndrome calculator 240, a key equation device 250, a Chien searcher 260, an address counter 270, a latch 280, a switching device 290 and a correcting unit 295. The data processing circuit 200 is substantially disposed in the memory module, and the memory module substantially further includes a memory cell array (not shown).

The sense amplifier 210 reads target page data from the memory cell array. The target page data substantially includes multiple error correction codes. The sense amplifier 210 outputs the target page data to the page buffer 220, wherein the page buffer 220 is a static random access memory (SRAM), for example. In addition, the memory module usually encounters a margin threshold voltage test to find a column memory cell with a programmed-error. If the margin threshold voltage test has found the memory cell with the programmed-error, the target page data substantially includes multiple programmed-correct bits and multiple programmed-error bits, and addresses of the programmed-error bits are stored into the address counter 270. The latch 280 coupled to the address counter 270 temporarily stores the addresses of the programmed-error bits.

In the following example to be illustrated, the target page data includes "10X0 . . . 0X11" and three bits of error correction codes, wherein "X" represents the programmed-error bit and the other bits are the programmed-correct bits. The sense amplifier 210 transfers the target page data to the first syndrome calculator 230 and the second syndrome calculator 240. The first syndrome calculator 230 and the second syndrome calculator 240 respectively obtain a first syndrome polynomial and a second syndrome polynomial according to the target page data, wherein the first syndrome polynomial and the second syndrome polynomial are transferred to the key equation device 250. In addition, the first syndrome calculator 230 sets the multiple programmed-error bits in the target page data as "1" to save the target page data as a first codeword, such as "1010 . . . 0111". The second syndrome calculator 240 sets the multiple programmed-error bits in the target page data as "0" to save the target page data as a second codeword, such as "1000 . . . 0011".

The key equation device 250 obtains an errata locator polynomial according to the received syndrome polynomials and transfers the errata locator polynomial to the Chien searcher 260. The Chien searcher 260 obtains a set of reference codes according to the errata locator polynomial. In addition, the key equation device 250 further judges the first codeword "1010 . . . 0111" and the second codeword "1000 . . . 0011" according to the errata locator polynomial to obtain a first error count and a second error count, respectively.

FIG. 3 is a partially schematic illustration showing the first error count and the second error count according to the preferred embodiment of the invention. In the following example, the target page data includes six programmed-error bits. Because the target page data includes three bits of error correction codes, the key equation device 250 can obtain the errata locator polynomial and judge whether the first codeword "1010 . . . 0111" and the second codeword "1000 . . . 0011" are correct. If the correct data of the six programmed-error bits is "111111", for example, the first codeword obtained by the first syndrome calculator 230 is completely correct with respect to the six bits, and the key equation device 250 obtains the first error count of "0". Meanwhile, the second codeword obtained by the second syndrome calculator 240 is completely incorrect with respect to the six bits. In addition, because the error correction codes only have three bits, the key equation device 250 obtains the second error count of "3".

If the correct data of the six programmed-error bits is "111110", for example, the first codeword obtained by the first syndrome calculator 230 has one bit of error with respect to the six bits, and the key equation device 250 obtains the first error count of "1". Meanwhile, the second codeword obtained by the second syndrome calculator 240 has five bits of errors with respect to the six bits. In addition, because the error correction codes only have three bits, the key equation device 250 obtains the second error count of "3".

If the correct data of the six programmed-error bits is "111100", for example, the first codeword obtained by the first syndrome calculator 230 has two bits of errors with respect to the six bits, and the key equation device 250 obtains the first error count of "2". Meanwhile, the second codeword obtained by the second syndrome calculator 240 has four bits of errors with respect to the six bits. In addition, because the error correction codes only have three bits, the key equation device 250 obtains the second error count of "3".

If the correct data of the six programmed-error bits is "111000", for example, the first codeword obtained by the first syndrome calculator 230 has three bits of errors with respect to the six bits, and the key equation device 250 obtains the first error count of "3". Meanwhile, the second codeword obtained by the second syndrome calculator 240 has three bits of errors with respect to the six bits, and the key equation device 250 obtains the second error count of "3".

If the correct data of the six programmed-error bits is "110000", for example, the first codeword obtained by the first syndrome calculator 230 has four bits of errors with respect to the six bits. In addition, because the error correction codes only have three bits, the key equation device 250 obtains the first error count of "3". Meanwhile, the second codeword obtained by the second syndrome calculator 240 has two bits of errors with respect to the six bits, and the key equation device 250 obtains the second error count of "2".

If the correct data of the six programmed-error bits is "100000", for example, the first codeword obtained by the first syndrome calculator 230 has five bits of errors with respect to the six bits. In addition, because the error correction codes only have three bits, the key equation device 250 obtains the first error count of "3". Meanwhile, the second codeword obtained by the second syndrome calculator 240 has one bit of error with respect to the six bits, and the key equation device 250 obtains the second error count of "1".

If the correct data of the six programmed-error bits is "000000", for example, the first codeword obtained by the first syndrome calculator 230 is completely incorrect with respect to the six bits. In addition, because the error correction codes only have three bits, the key equation device 250 obtains the first error count of "3". Meanwhile, the second codeword obtained by the second syndrome calculator 240 is completely correct with respect to the six bits, and the key equation device 250 obtains the second error count of "0". In addition, after the key equation device 250 has obtained the first error count and the second error count, it further compares the first error count with the second error count.

For example, the switching device 290 is a multiplexer coupled to the key equation device 250 and the page buffer 220, and controlled by the latch 280 to output read page data according to the addresses of the programmed-error bits, the first error count and the second error count. When outputting address are not the addresses of the programmed-error bits, the latch 280 enables the switching device 290 to output the corresponding programmed-correct bits stored in the page buffer 220. When the outputting addresses are the addresses of the programmed-error bits and the first error count is smaller than the second error count, it represents that the correct values of more programmed-error bits are "1", so the latch 280 enables the switching device 290 to output "1" to replace the programmed-error bits according to the first error count.

When the outputting addresses are the addresses of the programmed-error bits and the first error count is greater than the second error count, it represents that the correct values of more programmed-error bits are "0", so the latch 280 enables the switching device 290 to output "0" to replace the programmed-error bits according to the second error count. When the outputting addresses are the addresses of the programmed-error bits and the first error count is equal to the second error count, it represents that the number of the correct values of "1" in the programmed-error bits is equal to the number of the correct values of "0" in the programmed-error bits, so the latch 280 enables the switching device 290 to output "1" or "0" to replace the programmed-error bits.

The switching device 290 outputs the read page data to the correcting unit 295. The correcting unit 295 is, for example, an XOR gate for performing an XOR operation according to the corresponding bits of the set of reference codes and the read page data to obtain corrected read page data.

Figure 4:
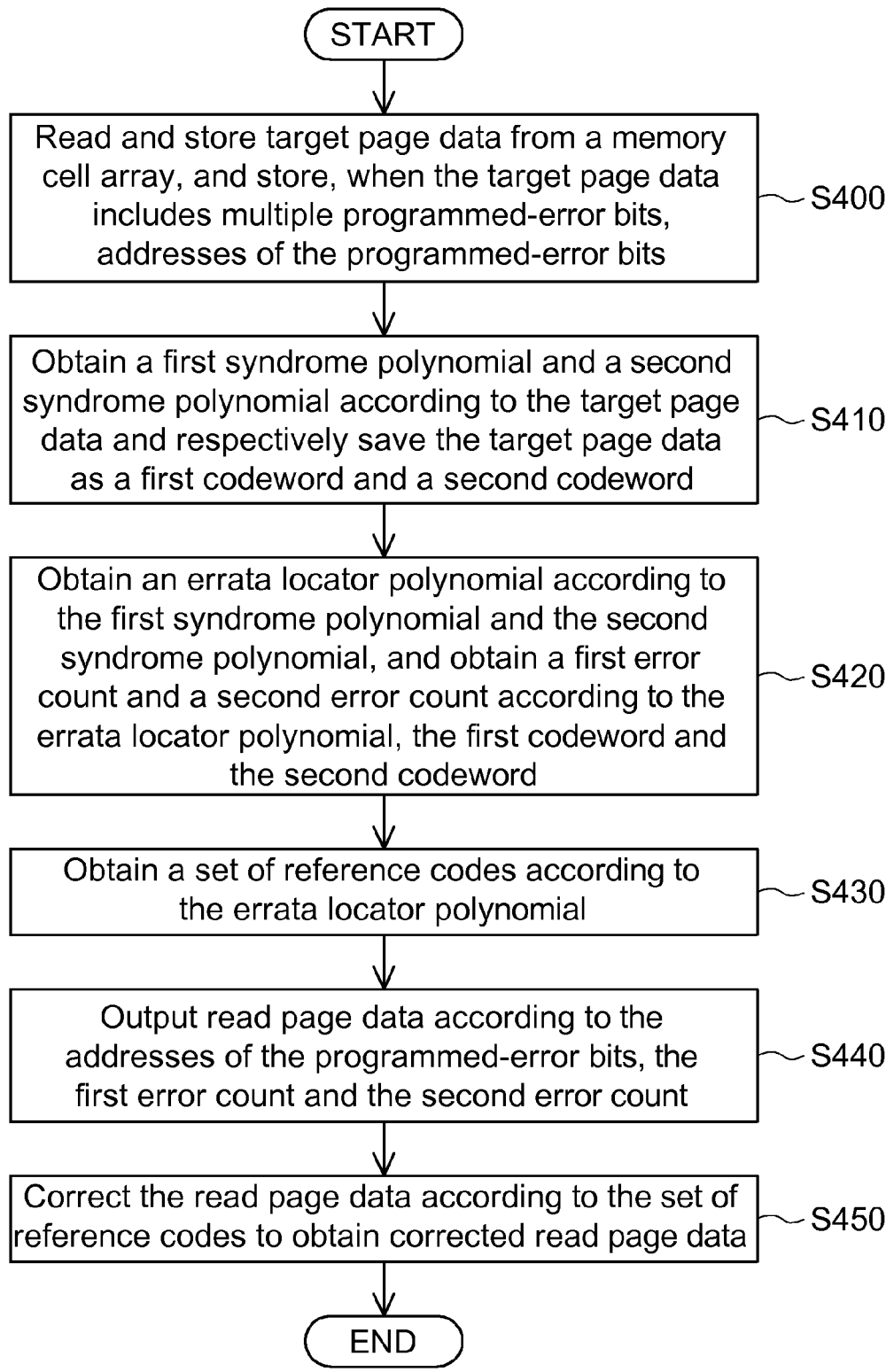
FIG. 4 is a flow chart showing a data processing method of the memory module according to the preferred embodiment of the invention.

The invention also provides a data processing method of the memory module. FIG. 4 is a flow chart showing a data processing method of the memory module according to the preferred embodiment of the invention. In step S400, target page data are read from a memory cell array and then stored. When the target page data includes multiple programmed-error bits, addresses of the programmed-error bits are stored. In step S410, a first syndrome polynomial and a second syndrome polynomial are obtained according to the target page data, and the target page data are saved as a first codeword and a second codeword.

In step S420, an errata locator polynomial is obtained according to the first syndrome polynomial and the second syndrome polynomial, and a first error count and a second error count are obtained according to the errata locator polynomial, the first codeword and the second codeword. In step S430, a set of reference codes is obtained according to the errata locator polynomial. In step S440, read page data are outputted according to the addresses of the programmed-error bits, the first error count and the second error count. In step S450, the read page data are corrected according to the set of reference codes to obtain corrected read page data.

The operation principle of the data processing method of the memory module has been described in the data processing circuit 200 of the memory module in detail, so detailed descriptions thereof will be omitted.

In the data processing circuit and method of the memory module according to the embodiment of the invention, multi-bit error correction codes are used to correct the programmed-error bits. So, the number of column repair units can be reduced, the overall available capacity of the memory can be increased, and the hardware cost of the memory can be lowered. In addition, the correct values of more programmed-error bits are selected and outputted according to the first error count and the second error count in the above-mentioned embodiment. Consequently, 2m bits of programmed-error bits can be corrected with respect to m bits of error correction codes, and the required number of the column repair units can be greatly decreased.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A data processing circuit, comprising:
a page buffer for storing target page data;
a first syndrome calculator and a second syndrome calculator for respectively obtaining a first syndrome polynomial and a second syndrome polynomial according to the target page data, and for respectively saving the target page data as a first codeword and a second codeword;
a key equation device for obtaining an errata locator polynomial according to the first syndrome polynomial and the second syndrome polynomial, and obtaining a first error count and a second error count according to the errata locator polynomial, the first codeword and the second codeword;
a Chien searcher for obtaining a set of reference codes according to the errata locator polynomial;
an address counter for storing addresses of a plurality of programmed-error bits;
a latch, which is coupled to the address counter and for temporarily storing the addresses of the programmed-error bits;
a switching device, which is coupled to the key equation device, the latch and the page buffer, and for outputting read page data according to the addresses of the programmed-error bits, the first error count and the second error count; and
a correcting unit for correcting the read page data according to the set of reference codes to obtain corrected read page data.

2. The data processing circuit according to claim 1, wherein the target page data comprises a plurality of programmed-correct bits and the programmed-error bits, the page buffer stores the programmed-correct bits and the programmed-error bits, the first syndrome calculator sets the programmed-error bits as "1" to save the target page data as the first codeword, and the second syndrome calculator sets the programmed-error bits as "0" to save the target page data as the second codeword.

3. The data processing circuit according to claim 2, wherein the key equation device judges the first codeword and the second codeword according to the errata locator polynomial to obtain the first error count and the second error count, respectively, and compares the first error count with the second error count.

4. The data processing circuit according to claim 3, wherein the switching device is coupled to the page buffer and the key equation device and is controlled by the latch, and the latch enables the switching device to output the corresponding programmed-correct bits stored in the page buffer when outputting addresses are not the addresses of the programmed-error bits.

5. The data processing circuit according to claim 4, wherein when the outputting addresses are the addresses of the programmed-error bits and the first error count is smaller than the second error count, the latch enables the switching device to output "1" according to the first error count to replace the programmed-error bits.

6. The data processing circuit according to claim 4, wherein when the outputting addresses are the addresses of the programmed-error bits and the first error count is greater than the second error count, the latch enables the switching device to output "0" according to the second error count to replace the programmed-error bits.

7. The data processing circuit according to claim 4, wherein when the outputting addresses are the addresses of the programmed-error bits and the first error count is equal to the second error count, the latch enables the switching device to output "1" or "0" to replace the programmed-error bits.

8. The data processing circuit according to claim 1, wherein the correcting unit is an XOR gate for performing an XOR operation according to corresponding bits in the set of reference codes and the read page data to obtain the corrected read page data.

9. A data processing method, comprising the steps of:
reading target page data from a memory cell array, and storing addresses of a plurality of programmed-error bits;
obtaining a first syndrome polynomial and a second syndrome polynomial according to the target page data, and saving the target page data as a first codeword and a second codeword;
obtaining an errata locator polynomial according to the first syndrome polynomial and the second syndrome polynomial, and obtaining a first error count and a second error count according to the errata locator polynomial, the first codeword and the second codeword;
obtaining a set of reference codes according to the errata locator polynomial;
outputting read page data according to the addresses of the programmed-error bits, the first error count and the second error count; and
correcting the read page data to obtain corrected read page data according to the set of reference codes.

10. The method according to claim 9, wherein the target page data comprises a plurality of programmed-correct bits and the programmed-error bits, and the step of saving the target page data as the first codeword and the second codeword comprises:
setting the programmed-error bits as "1" to save the target page data as the first codeword; and
setting the programmed-error bits as "0" to save the target page data as the second codeword.

11. The method according to claim 10, further comprising the steps of:
judging the first codeword and the second codeword according to the errata locator polynomial to respectively obtain the first error count and the second error count; and
comparing the first error count with the second error count.

12. The method according to claim 11, wherein the step of outputting the read data comprises:
outputting the corresponding programmed-correct bits when outputting addresses are not the addresses of the programmed-error bits;
outputting "1" to replace the programmed-error bits when the outputting addresses are the addresses of the programmed-error bits and the first error count is smaller than the second error count;
outputting "0" to replace the programmed-error bits when the outputting addresses are the addresses of the programmed-error bits and the first error count is greater than the second error count; and
outputting "1" or "0" to replace the programmed-error bits when the outputting addresses are the addresses of the programmed-error bits and the first error count is equal to the second error count.

13. The method according to claim 9, wherein the step of obtaining the corrected read page data is to perform an XOR operation according to corresponding bits in the set of reference codes and the read page data to obtain the corrected read page data.

* * * * *